(12) United States Patent
Choi et al.

(10) Patent No.: US 10,424,629 B2
(45) Date of Patent: Sep. 24, 2019

(54) DISPLAY DEVICE

(71) Applicant: Samsung Display Co., Ltd., Yongin-si (KR)

(72) Inventors: Sang Moo Choi, Yongin-si (KR); Won Kyu Kwak, Seongnam-si (KR); Dong Wook Kim, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/868,973

(22) Filed: Jan. 11, 2018

(65) Prior Publication Data

US 2018/0286937 A1 Oct. 4, 2018

(30) Foreign Application Priority Data

Mar. 31, 2017 (KR) .................. 10-2017-0041890

(51) Int. Cl.
*G06F 3/041* (2006.01)
*H01L 27/32* (2006.01)
*H01L 51/52* (2006.01)
*G09G 3/3258* (2016.01)
(Continued)

(52) U.S. Cl.
CPC ........ *H01L 27/3276* (2013.01); *G06F 3/0412* (2013.01); *H01L 51/5228* (2013.01); *H01L 51/5253* (2013.01); *H01L 51/5256* (2013.01); *G06F 3/044* (2013.01); *G09G 3/3233* (2013.01); *G09G 3/3258* (2013.01); *G09G 2300/0819* (2013.01); *G09G 2300/0842* (2013.01);
(Continued)

(58) Field of Classification Search
CPC ..... G06F 3/0412; G06F 3/044; G09G 3/3233; G09G 3/3258; G09G 2300/0819; G09G 2300/0842; G09G 2320/0233; H01L 27/3276; H01L 27/323; H01L 27/3246; H01L 51/5253; H01L 51/5256
See application file for complete search history.

(56) References Cited

U.S. PATENT DOCUMENTS 9,373,662 B2  6/2016  Her et al.
9,570,531 B2  2/2017  Chung et al.
(Continued)

FOREIGN PATENT DOCUMENTS

KR  10-2015-0001165  1/2015
KR  10-2015-0124507  11/2015
(Continued)

*Primary Examiner* — Lisa S Landis
(74) *Attorney, Agent, or Firm* — H.C. Park & Associates, PLC

(57) ABSTRACT

A display device includes: a substrate: a first electrode and a second electrode disposed on the substrate and facing each other; an emission layer disposed between the first electrode and the second electrode; a common voltage line disposed on the substrate and connected to the second electrode to transmit a common voltage; a thin film encapsulation layer covering the second electrode; auxiliary wiring disposed on the thin film encapsulation layer and connected to the common voltage line; a covering layer covering the auxiliary wiring; and a touch panel disposed on the covering layer. Thus, a voltage drop of the common voltage ELVSS may be minimized, and the luminance uniformity may be improved.

19 Claims, 9 Drawing Sheets

(51) Int. Cl.
*G06F 3/044* (2006.01)
*G09G 3/3233* (2016.01)

(52) U.S. Cl.
CPC .... *G09G 2320/0233* (2013.01); *H01L 27/323* (2013.01); *H01L 27/3246* (2013.01)

(56) References Cited

U.S. PATENT DOCUMENTS

2015/0255017 A1* 9/2015 Kim ................... G09G 3/3258
  315/172
2015/0316802 A1* 11/2015 Takanishi ............ H01L 27/1244
  349/43

FOREIGN PATENT DOCUMENTS

KR  10-2016-0039704  4/2016
KR  10-2016-0052844  5/2016

* cited by examiner

DISPLAY DEVICE

CROSS-REFERENCE TO RELATED APPLICATION

This application claims priority from and the benefit of Korean Patent Application No. 10-2017-0041890, filed on Mar. 31, 2017, which is hereby incorporated by reference for all purposes as if fully set forth herein.

BACKGROUND

Field

Exemplary embodiments relate to a display device.

Discussion of the Background

In general, a liquid crystal display (LCD), an organic light emitting diode (OLED) display, etc., is used as a display device.

Particularly, the organic light emitting diode display includes two electrodes and an organic light emitting layer disposed therebetween. Electrons injected from a cathode and holes injected from an anode are bonded to each other in the organic light emitting layer to form excitons. Light is emitted while the excitons discharge energy.

The organic light emitting diode display includes a plurality of pixels each including an organic light emitting diode formed of the cathode, the anode, and the organic light emitting layer. In the organic light emitting diode display, a driving voltage line is used for transmitting a driving voltage ELVDD to the pixel and a common voltage line is used for transmitting a common voltage ELVSS to the pixel.

To uniformly supply the common voltage ELVSS to the entire region of the organic light emitting diode display of a medium or large size, a flexible printed circuit (FPC) or a chip-on-film (COF) are respectively attached on and under the organic light emitting diode display. When supplying the common voltage ELVSS to the pixel through the flexible printed circuit (FPC) respectively connected on and under the organic light emitting diode display, a voltage drop of the common voltage ELVSS may be minimized by minimizing a load of the common voltage line. However, because the flexible printed circuit (FPC) must be bonded on two sides of the organic light emitting diode display, a bonding defect rate may increase, and an upper bonding region is additionally required, thereby increasing a dead space.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode display that is capable of simultaneously minimizing a voltage drop of a common voltage and improving luminance uniformity.

Additional aspects will be set forth in the detailed description which follows, and, in part, will be apparent from the disclosure, or may be learned by practice of the inventive concepts.

According to exemplary embodiments, a display device includes: a substrate; a first electrode and a second electrode disposed on the substrate and facing each other; an emission layer disposed between the first electrode and the second electrode; a common voltage line disposed on the substrate and connected to the second electrode to transmit a common voltage; a thin film encapsulation layer covering the second electrode; auxiliary wiring disposed on the thin film encapsulation layer and connected to the common voltage line; a covering layer covering the auxiliary wiring; and a touch panel disposed on the covering layer.

The auxiliary wiring and the touch panel may be disposed so as to overlap.

The auxiliary wiring may be in contact with a side wall of the thin film encapsulation layer.

The common voltage line may include a first common voltage line disposed in a first region of the substrate and a second common voltage line disposed in a second region of the substrate, and the auxiliary wiring may connect the first common voltage line and the second common voltage line.

A display device according to another exemplary embodiment includes: a substrate; a first electrode and a second electrode disposed on the substrate and facing each other; an emission layer disposed between the first electrode and the second electrode; a common voltage line disposed on the substrate and connected to the second electrode to transmit a common voltage; a thin film encapsulation layer covering the second electrode; touch wiring disposed on the thin film encapsulation layer; and auxiliary wiring disposed on the same layer as the touch wiring and connected to the common voltage line.

The auxiliary wiring and the touch wiring may be disposed so as to not overlap.

The auxiliary wiring and the touch wiring may include the same material.

The common voltage line may include a first common voltage line disposed in a first region of the substrate and a second common voltage line disposed in a second region of the substrate, and the auxiliary wiring may connect the first common voltage line and the second common voltage line.

A display device according to another exemplary embodiment includes: a substrate; a first electrode and a second electrode disposed on the substrate and facing each other; an emission layer disposed between the first electrode and the second electrode; a common voltage line disposed on the substrate and connected to the second electrode to transmit a common voltage; a thin film encapsulation layer covering the second electrode; auxiliary wiring disposed on the thin film encapsulation layer and connected to the common voltage line; an insulating layer covering the auxiliary wiring; touch wiring disposed on the insulating layer; and a covering layer covering the touch wiring.

The auxiliary wiring may be in contact with a side wall of the thin film encapsulation layer.

The common voltage line may include a first common voltage line disposed in a first region of the substrate and a second common voltage line disposed in a second region of the substrate, and the auxiliary wiring may connect the first common voltage line and the second common voltage line.

According to an exemplary embodiment, the voltage drop of the common voltage may be minimized and the luminance uniformity may be simultaneously improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept.

DETAILED DESCRIPTION OF THE ILLUSTRATED EMBODIMENTS

Figure 1:
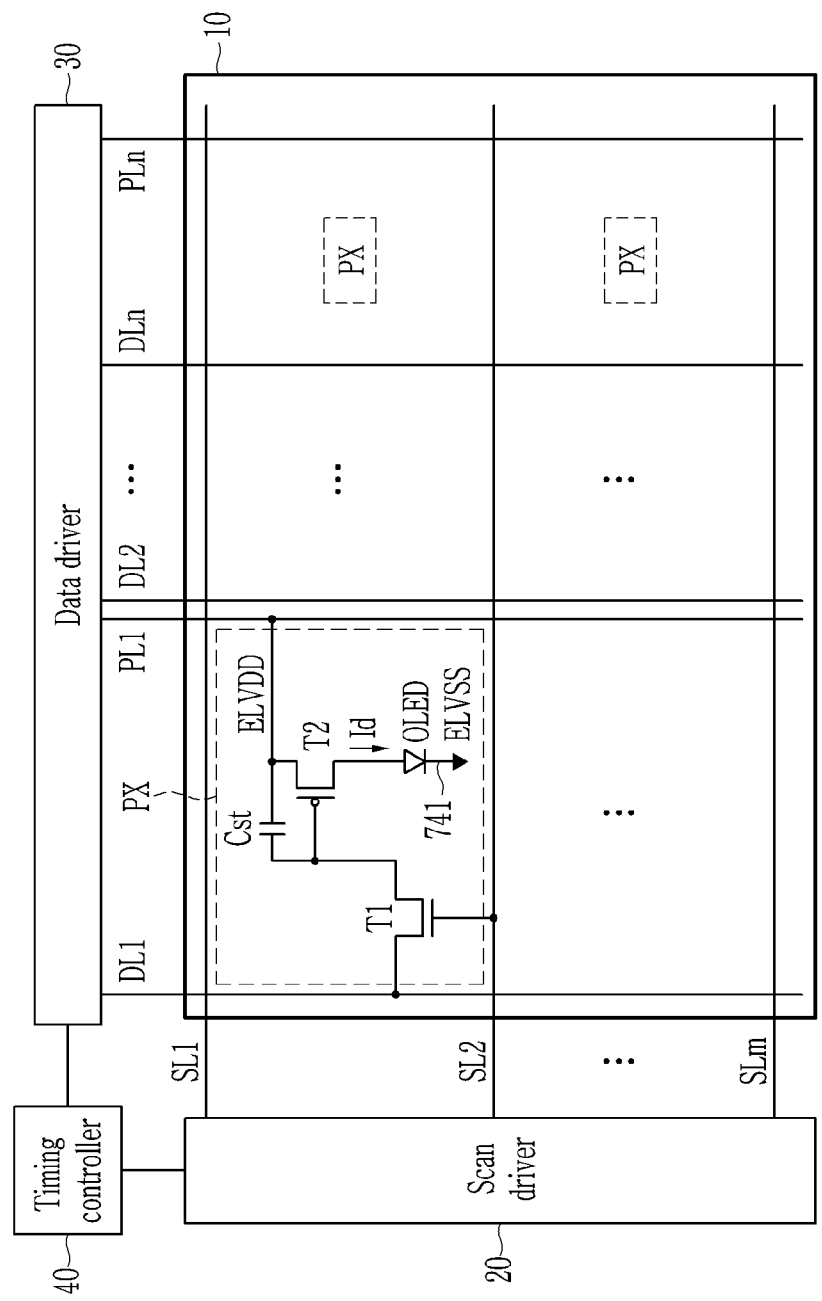
FIG. 1 is a block diagram of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A display device according to an exemplary embodiment will be described below with reference to accompanying drawings.

FIG. 1 is a block diagram of a display device according to an exemplary embodiment.

As shown in FIG. 1, a display device according to an exemplary embodiment includes a display panel 10, a scan driver 20, a data driver 30, and a timing controller 40.

The display panel 10 may include a plurality of scan lines SL1 to SLm, a plurality of data lines DL1 to DLn, and a plurality of driving voltage lines PL1 to PLn that are crossed to define a plurality of pixels PX. The plurality of scan lines SL1 to SLm may extend in an approximate row direction and may be almost parallel to each other, and the plurality of data lines DL1 to DLn and the plurality of driving voltage lines PL1 to PLn may extend in an approximate column direction and may be almost parallel to each other.

Each pixel PX may include a switching transistor T1 that is respectively coupled to the plurality of scan lines SL1 to SLm and the plurality of data lines DL1 to DLn, a storage capacitor Cst and a driving transistor T2 that are respectively coupled between a plurality of switching transistors T1 and a plurality of driving voltage lines PL1 to PLn, and an organic light emitting diode (OLED) that is coupled to the driving transistor T2.

The scan driver 20 may apply a scan signal to the plurality of scan lines SL1 to SLm, and the data driver 30 may apply a data signal to the plurality of data lines DL1 to DLn.

The switching transistor T1 may include a control terminal, an input terminal, and an output terminal, wherein the control terminal is coupled to the scan lines SL1 to SLm, the input terminal is coupled to the data lines DL1 to DLn, and the output terminal is coupled to the driving transistor T2. In response to the scan signal applied to the scan lines SL1 to SLm, the switching transistor T1 may transmit the data signal applied to the data lines DL1 to DLn to the driving transistor T2.

The driving transistor T2 may also include a control terminal, an input terminal, and an output terminal, wherein the control terminal is coupled to the switching transistor T1, the input terminal is coupled to the driving voltage lines PL1 to PLn, and the output terminal is coupled to the organic light emitting diode OLED.

The organic light emitting diode OLED may include an anode coupled to the output terminal of the driving transistor T2, and a cathode coupled to the common voltage line 741 transmitting a common voltage ELVSS.

If the switching transistor T1 is turned on according to the scan signal, the data signal may be charged to the storage capacitor Cst and the control terminal of the driving transistor T2, and as a result, the driving transistor T2 may turned on to apply the driving voltage ELVDD of the driving voltage lines PL1 to PLn to the organic light emitting diode OLED, thereby allowing the organic light emitting diode OLED to emit light.

The timing controller 40 may receive image signals and various control signals from an external system (not shown), and generate RGB signals, a data control signal, and a scan control signal to transmit to the scan driver 20 and the data driver 30.

Figure 2:
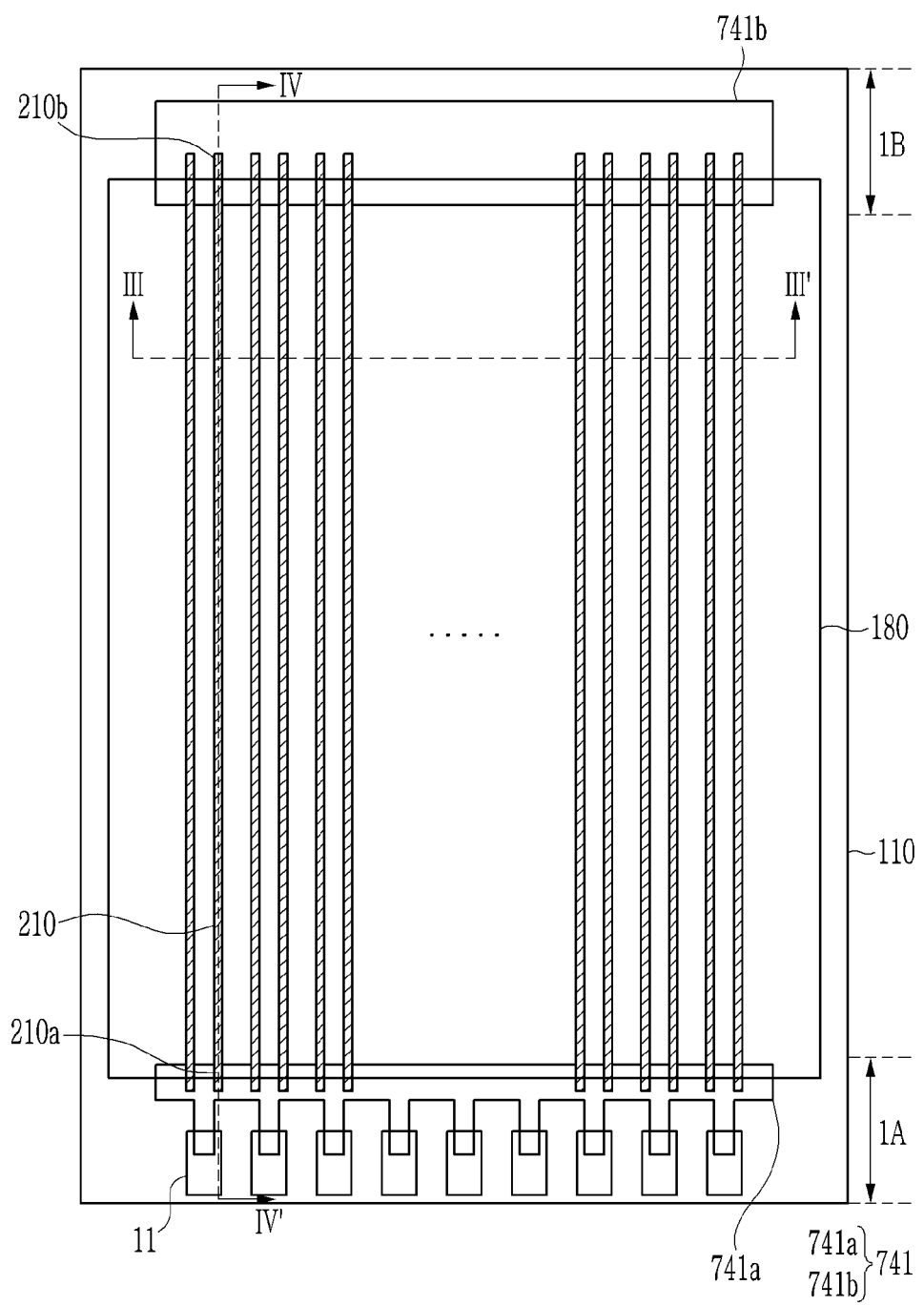
FIG. 2 is a schematic top plan view of a display device according to an exemplary embodiment.
Figure 3:
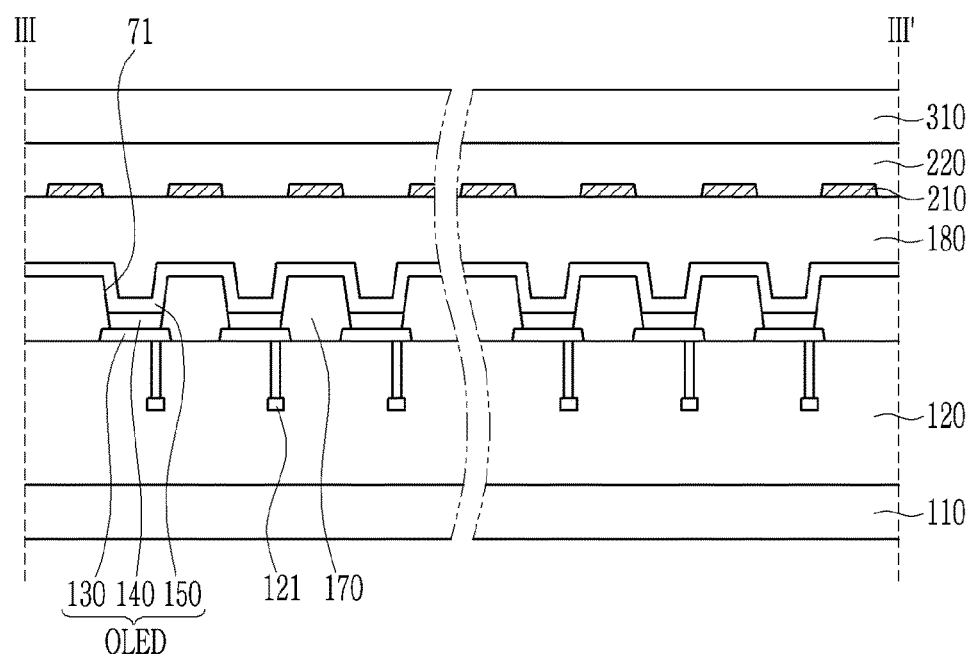
FIG. 3 is a cross-sectional view taken along a line III-III' of FIG. 2.
Figure 4:
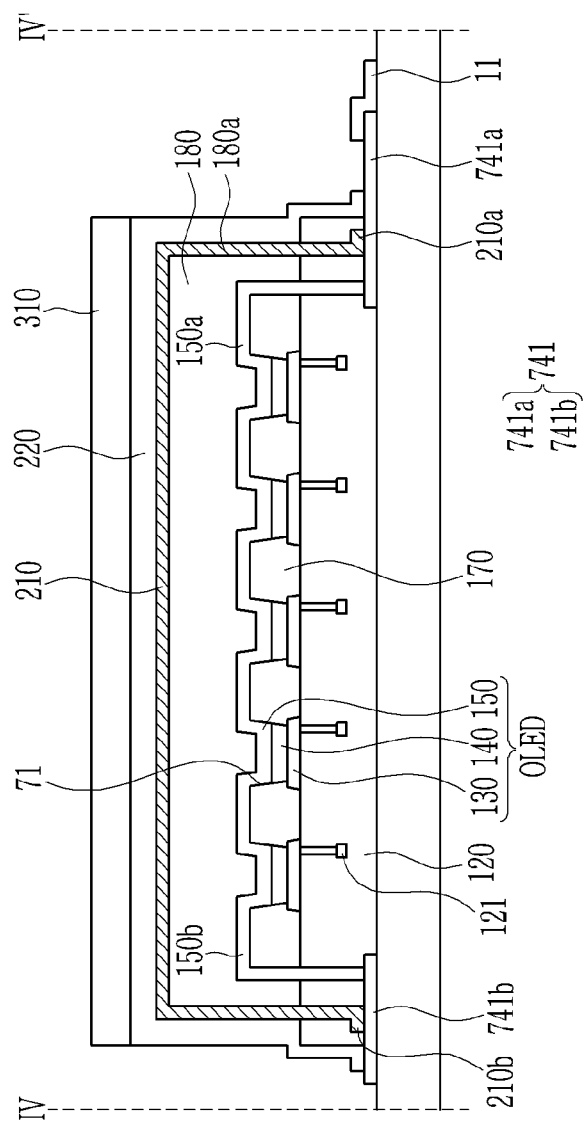
FIG. 4 is a cross-sectional view taken along a line IV-IV' of FIG. 2.

FIG. 2 is a schematic top plan view of a display device according to an exemplary embodiment, FIG. 3 is a cross-sectional view taken along a line III-III' of FIG. 2, and FIG. 4 is a cross-sectional view taken along a line IV-IV' of FIG. 2.

As shown in FIGS. 2, 3, and 4, a switching layer 120 including a switching element 121 may be disposed on a substrate 110. The substrate 110 may be an insulating substrate made of glass, quartz, ceramic, plastic, etc., or a metal substrate made of stainless steel and the like. The switching element 121 of the switching layer 120 may include a gate electrode, a source electrode, and a drain electrode. The switching element 121 may be a transistor for turning each pixel PX on/off. The switching layer 120 may include a plurality of insulating layers for insulating the gate electrode, the source electrode, and the drain electrode. These insulating layers may include an inorganic layer or an organic layer.

Also, as shown in FIGS. 2 and 4, a common voltage line 741 transmitting a common voltage ELVSS is disposed on the substrate 110. The common voltage line 741 may include a first common voltage line 741a disposed in a first region 1A of the substrate 110 and a second common voltage line 741b disposed in a second region 1B of the substrate 110. The first common voltage line 741a may be in contact with a common voltage pad 11 for receiving the common voltage ELVSS from the outside. The first region 1A may correspond to a lower region of the substrate 110 adjacent to the common voltage pad 11, and the second region 1B may correspond to an upper region of the substrate 110 opposite the first region 1A.

A first electrode 130 connected to the switching element 121 may be disposed on the switching layer 120, and a pixel definition layer (PDL) 170 having a pixel opening 71 overlapping the first electrode 130 may be disposed on the first electrode 130. Also, an emission layer 140 may be disposed in the pixel opening 71 and a second electrode 150 may be disposed on the emission layer 140 and the pixel definition layer 170.

The first electrode 130 may include a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc.

The pixel definition layer 170 may include an organic material such as a polyacryl-based resin (polyacrylic resin), a polyimide-based resin (polyimide resin), etc., or a silica-based inorganic material.

The second electrode 150 may include a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc.

The first electrode 130, the organic emission layer 140, and the second electrode 150 may form the organic light emitting diode OLED.

Here, the first electrode 130 may become an anode as a hole injection electrode, and the second electrode 150 may become a cathode as an electron injection electrode. However, an exemplary embodiment is not limited thereto, and the first electrode 130 may be the cathode, and the second electrode 150 may be the anode. Holes and electrons may be injected from the first electrode 130 and the second electrode 150 inside the emission layer 140, and light may be emitted when an exciton of which the injected holes and electrons are combined falls from an excited state to a ground state.

As shown in FIG. 4, the second electrode 150 may be connected to the common voltage line 741, thereby receiving the common voltage ELVSS.

A thin film encapsulation layer 180 may be disposed on the second electrode 150, thereby covering the second electrode 150. The thin film encapsulation layer 180 may have a structure in which a plurality of organic layers and inorganic layers are alternately stacked.

Auxiliary wiring 210 may be disposed on the thin film encapsulation layer 180 and on a side wall 180a of the thin film encapsulation layer 180. That is, the auxiliary wiring 210 may be in contact with the side wall 180a of the thin film encapsulation layer 180 and also in contact with an upper surface of the thin film encapsulation layer 180. One end part 210a of the auxiliary wiring 210 may be in contact with the first common voltage line 741a, and the other end part 210b of the auxiliary wiring 210 may be in contact with the second common voltage line 741b. Accordingly, the auxiliary wiring 210 may connect the first common voltage line 741a and the second common voltage line 741b to each other.

A covering layer 220 may be disposed on the auxiliary wiring 210, thereby the covering layer 220 may cover the thin film encapsulation layer 180 and the auxiliary wiring 210. The covering layer 220 may be a single layer or a multilayer including at least one of a silicon nitride and a silicon oxide.

A touch panel 310 may be disposed on the covering layer 220. The touch panel 310 may be a separate input device in which a plurality of touch electrodes (not shown) for sensing a touch input of a user are formed. The touch panel 310 may be disposed to overlap the auxiliary wiring 210.

The common voltage ELVSS transmitted from the common voltage pad 11 to the first common voltage line 741a may be transmitted to a first part 150a of the second electrode 150 connected to the first common voltage line 741a. In this case, the common voltage ELVSS is also transmitted to the second common voltage line 741b along the auxiliary wiring 210 connected to the first common voltage line 741a. Also, the common voltage ELVSS may be transmitted from the second common voltage line 741b to a second part 150b of the second electrode 150. As such, the common voltage ELVSS may be almost simultaneously transmitted to the first part 150a and the second part 150b of the second electrode 150 through the auxiliary wiring 210. Accordingly, even if the common voltage pad 11 to which the common voltage ELVSS is transmitted is only disposed in the first region 1A of the substrate 110, the voltage drop of the common voltage ELVSS transmitted to the second part 150b of the second electrode 150 may be minimized. Also, by minimizing the voltage drop of the common voltage ELVSS, the luminance uniformity may be improved.

In an exemplary embodiment, the auxiliary wiring may be disposed on a different layer from the touch panel, but another exemplary embodiment in which the auxiliary wiring is disposed on the same layer as the touch wiring is possible.

Next, the display device according to another exemplary embodiment will be described with reference to FIG. 5 and FIG. 6.

Figure 5:
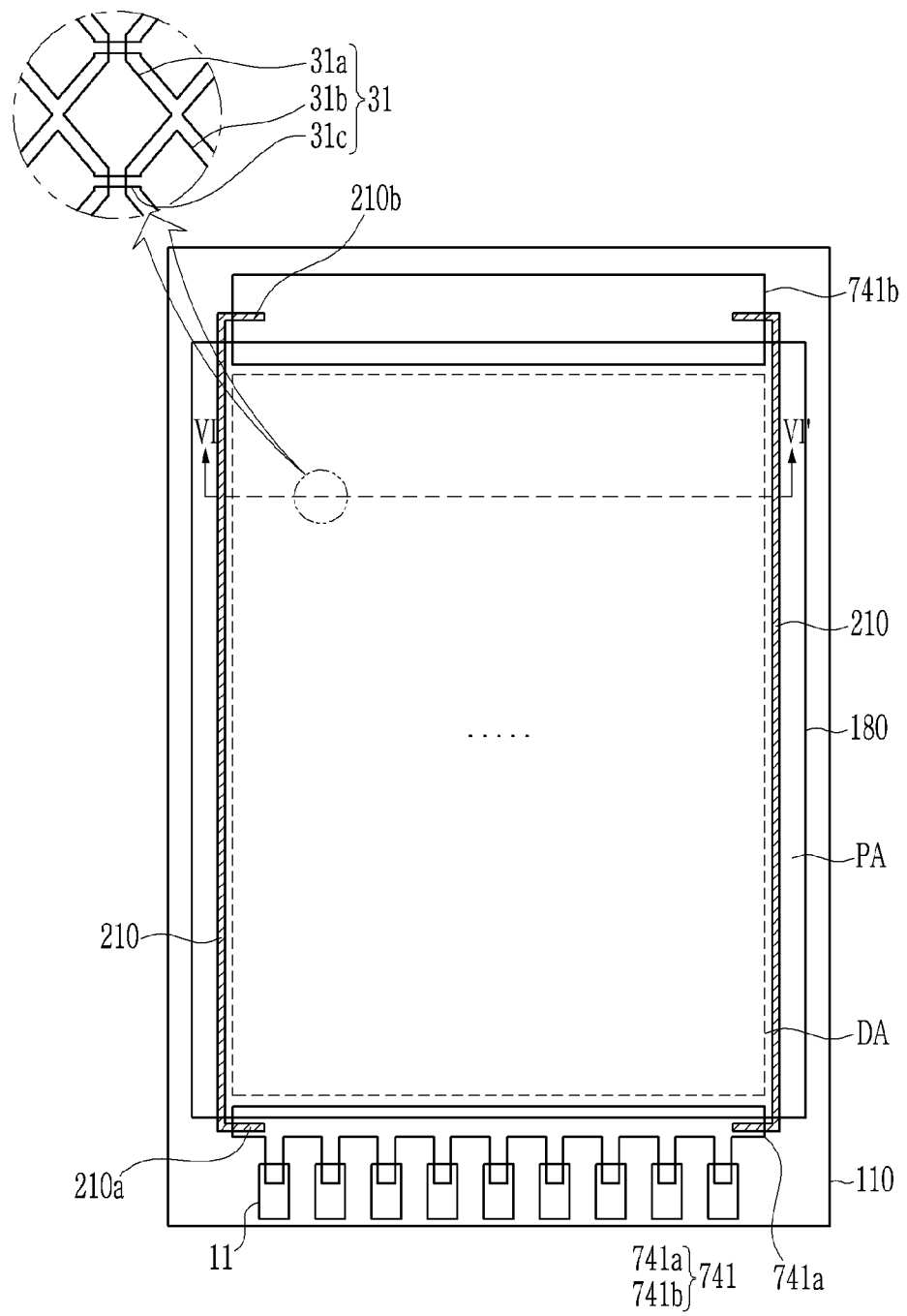
FIG. 5 is a schematic top plan view of a display device according to another exemplary embodiment.
Figure 6:
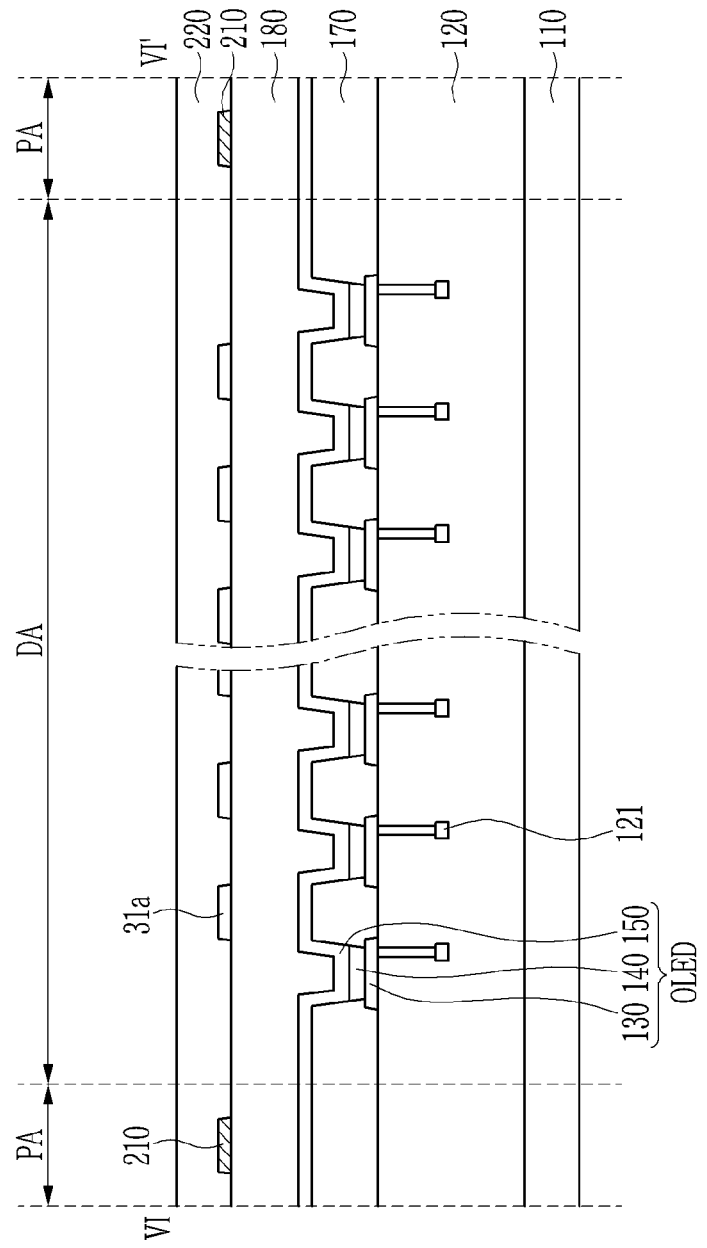
FIG. 6 is a cross-sectional view taken along a line VI-VI' of FIG. 5.

FIG. 5 is a schematic top plan view of a display device according to another exemplary embodiment, and FIG. 6 is a cross-sectional view taken along a line VI-VI' of FIG. 5.

The exemplary embodiment shown in FIG. 5 and FIG. 6 is substantially the same as the exemplary embodiment shown in FIGS. 1, 2, 3, and 4, except for the structure of the auxiliary wiring and the touch wiring, such that the repeated description is omitted.

As shown in FIG. 5 and FIG. 6, in the display device according to another exemplary embodiment of the present disclosure, the switching layer 120 including the switching element 121 may be disposed on the substrate 110. The common voltage line 741 transmitting the common voltage ELVSS may be disposed on the substrate 110. The first electrode 130, the emission layer 140, and the second electrode 150 may be sequentially disposed on the switching layer 120. The thin film encapsulation layer 180 may be disposed on the second electrode 150 to cover the second electrode 150.

The touch wiring 31 may be disposed in the first region DA in the thin film encapsulation layer 180. Also, the auxiliary wiring 210 may be disposed in the second region PA enclosing the first region DA. The first region DA may correspond to the pixel area in which the pixel is disposed to emit the light, and the second region PA may correspond to the peripheral area without the emission. The touch wiring 31 and the auxiliary wiring 210 may be disposed on the same layer and may be formed of the same material. The touch wiring 31 and the auxiliary wiring 210 may not overlap.

The touch wiring 31 may include a plurality of first touch electrodes 31a connected in the vertical direction and a plurality of second touch electrodes 31b connected to each other through a connection line 31c in the horizontal direction. In this exemplary embodiment, the first touch electrode 31a and the second touch electrode 31b may be formed in a rhombus shape, however it is not limited thereto, and they may be formed in various shapes. The first touch electrode 31a and the second touch electrode 31b may have a function of sensing a coordinate value by the touch of the user and transmitting the sensed coordinate value to an external driving circuit (not shown) to be converted into an electric signal.

As shown in FIG. 5, one end part 210a of the auxiliary wiring 210 may be in contact with the first common voltage line 741a, and the other end part 210b of the auxiliary wiring 210 may be in contact with the second common voltage line 741b. Accordingly, the auxiliary wiring 210 may connect the first common voltage line 741a and the second common voltage line 741b to each other.

The covering layer 220 may be disposed on the touch wiring 31 and the auxiliary wiring 210 such that the covering layer 220 covers the thin film encapsulation layer 180, the auxiliary wiring 210, and the touch wiring 31.

Accordingly, even if the common voltage pad 11 transmitting the common voltage ELVSS is only disposed in the first region 1A of the substrate 110, the voltage drop of the common voltage ELVSS transmitted to the second part 150b (referring to FIG. 4) of the second electrode 150 may be minimized. Also, as the voltage drop of the common voltage ELVSS may be minimized, the luminance uniformity may be improved.

In the exemplary embodiment shown in FIG. 5 and FIG. 6, the auxiliary wiring may be disposed on the same layer as the touch wiring, however another exemplary embodiment in which the auxiliary wiring is disposed on the different layer from the touch wiring may be possible.

Next, the display device according to another exemplary embodiment will be described with reference to FIGS. 7, 8, and 9.

Figure 7:
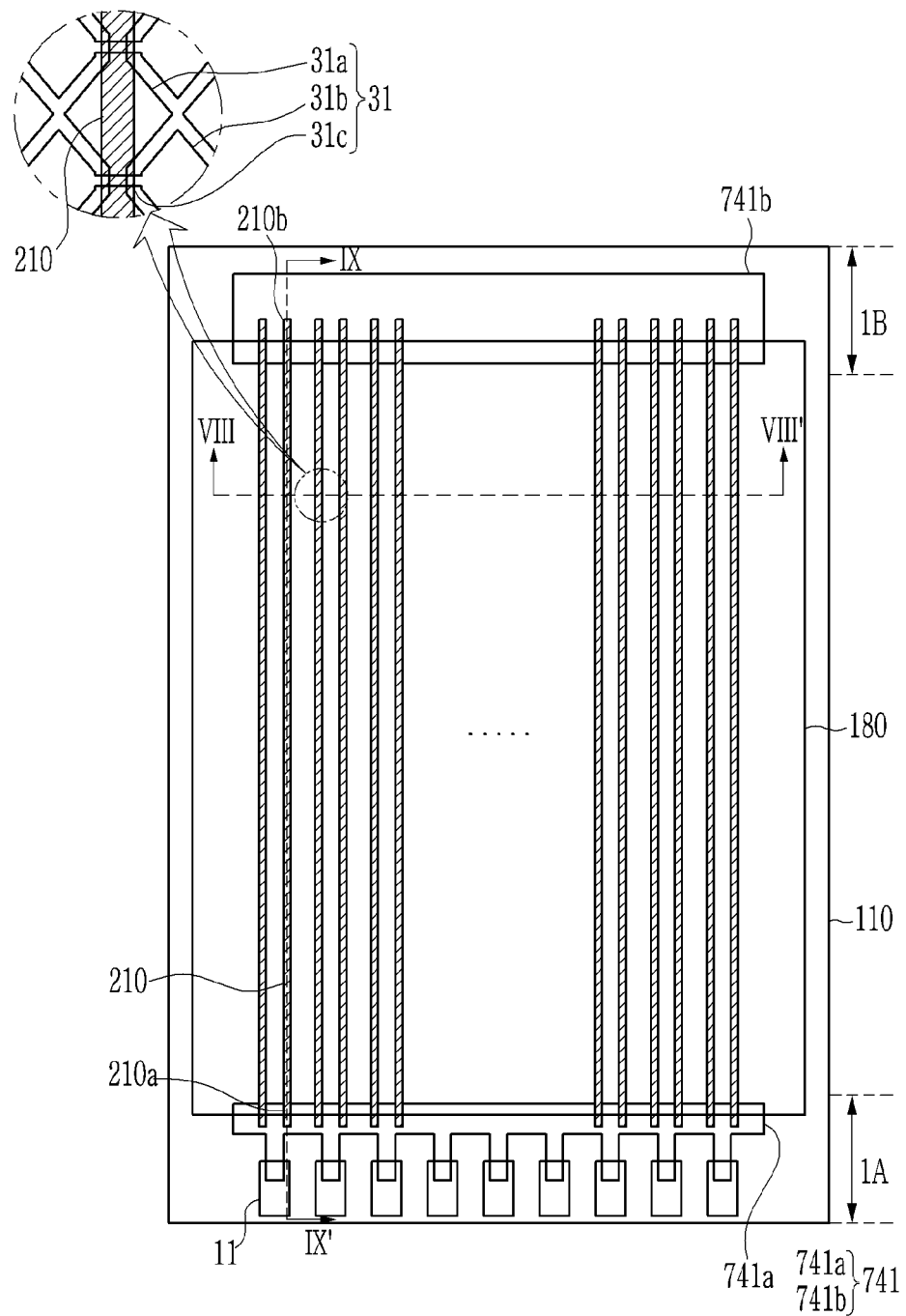
FIG. 7 is a schematic top plan view of a display device according to another exemplary embodiment.
Figure 8:
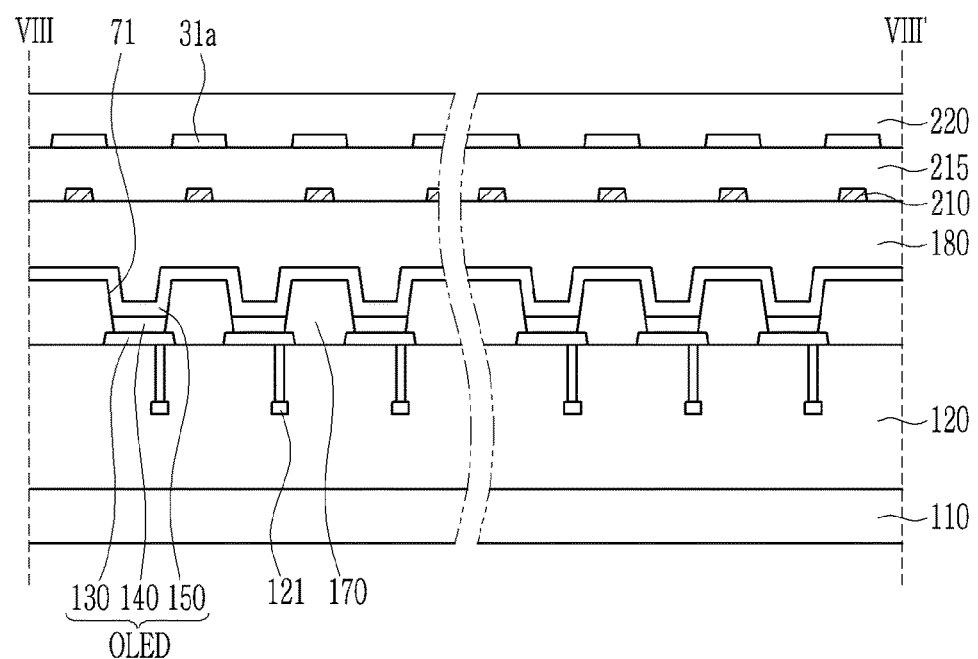
FIG. 8 is a cross-sectional view taken along a line VIII-VIII' of FIG. 7.
Figure 9:
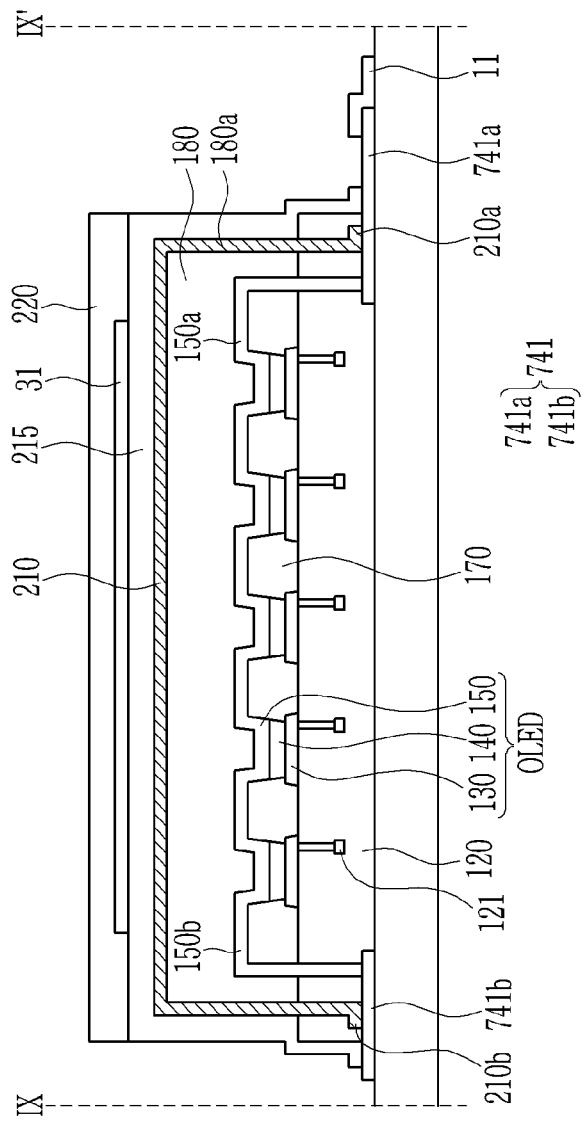
FIG. 9 is a cross-sectional view taken along a line IX-IX' of FIG. 7.

FIG. 7 is a schematic top plan view of a display device according to another exemplary embodiment, FIG. 8 is a cross-sectional view taken along a line VIII-VIII' of FIG. 7, and FIG. 9 is a cross-sectional view taken along a line IX-IX' of FIG. 7.

The exemplary embodiment shown in FIGS. 7, 8, and 9 is substantially the same as the exemplary embodiment shown in FIG. 5 and FIG. 6, except for the structure of the auxiliary wiring and the touch wiring, such that the repeated description is omitted.

As shown in FIGS. 7, 8, and 9, in the display device according to another exemplary embodiment of the present disclosure, the switching layer 120 including the switching element 121 may be disposed on the substrate 110. The common voltage line 741 transmitting the common voltage ELVSS may be disposed on the substrate 110. The first electrode 130, the emission layer 140, and the second electrode 150 may be sequentially disposed on the switching layer 120. The thin film encapsulation layer 180 may be disposed on the second electrode 150 to cover the second electrode 150.

The auxiliary wiring 210 may be disposed on the thin film encapsulation layer 180 and on the side wall 180a of the thin film encapsulation layer 180. That is, the auxiliary wiring 210 may be in contact with the side wall 180a of the thin film encapsulation layer 180 and may also be in contact with the upper surface of the thin film encapsulation layer 180. One end part 210a of the auxiliary wiring 210 may be in contact with the first common voltage line 741a, and the other end part 210b of the auxiliary wiring 210 may be in contact with the second common voltage line 741b. Accordingly, the auxiliary wiring 210 may connect the first common voltage line 741a and the second common voltage line 741b to each other.

An insulating layer 215 may be disposed on the auxiliary wiring 210 such that the insulating layer 215 covers the thin film encapsulation layer 180 and the auxiliary wiring 210.

The touch wiring 31 may be disposed on the insulating layer 215. The touch wiring 31 may include a plurality of first touch electrodes 31a connected in the vertical direction and a plurality of second touch electrodes 31b connected in the horizontal direction to each other through the connection line 31c. In this exemplary embodiment, the first touch electrode 31a and the second touch electrode 31b may be formed in a rhombus shape, however it is not limited thereto, and they may be formed in various shapes. The first touch electrode 31a and the second touch electrode 31b may have a function of sensing a coordinate value by the touch of the user, and transmitting the sensed coordinate value to an external driving circuit (not shown) to be converted into the electrical signal.

In this exemplary embodiment, the first touch electrode 31a may overlap the auxiliary wiring 210, however it is not limited thereto, and the second touch electrode 31b may be located at other positions.

The covering layer 220 may be disposed on the touch wiring 31 such that the covering layer 220 covers the insulating layer 215 and the touch wiring 31.

As such, the common voltage ELVSS may be almost simultaneously transmitted to the first part 150a and the second part 150b of the second electrode 150 through the auxiliary wiring 210. Accordingly, even if the common voltage pad 11 transmitting the common voltage ELVSS is only disposed in the first region 1A of the substrate 110, the voltage drop of the common voltage ELVSS transmitted to the second part 150b of the second electrode 150 may be minimized. Also, as the voltage drop of the common voltage ELVSS may be minimized, the luminance uniformity may be improved.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a substrate;
a first electrode and a second electrode disposed on the substrate and facing each other;
an emission layer disposed between the first electrode and the second electrode;
a common voltage line disposed on the substrate and connected to the second electrode to transmit a common voltage;
a thin film encapsulation layer covering the second electrode;
an auxiliary wiring disposed on the thin film encapsulation layer and connected to the common voltage line;
a covering layer covering the auxiliary wiring; and
a touch panel disposed on the covering layer.

2. The display device of claim 1, wherein
the auxiliary wiring and the touch panel are disposed to overlap each other in plan view.

3. The display device of claim 1, wherein:
the auxiliary wiring is in contact with a side wall of the thin film encapsulation layer.

4. The display device of claim 1, wherein:
the common voltage line comprises a first common voltage line disposed in a first region of the substrate and a second common voltage line disposed in a second region of the substrate, and
the auxiliary wiring connects the first common voltage line and the second common voltage line.

5. A display device comprising:
a substrate;
a first electrode and a second electrode disposed on the substrate and facing each other;
an emission layer disposed between the first electrode and the second electrode;
a common voltage line disposed on the substrate and connected to the second electrode to transmit a common voltage;
a thin film encapsulation layer covering the second electrode;
a touch wiring disposed on the thin film encapsulation layer; and
an auxiliary wiring disposed on the same layer as the touch wiring and connected to the common voltage line.

6. The display device of claim 5, wherein:
the auxiliary wiring and the touch wiring do not overlap each other in plan view.

7. The display device of claim 5, wherein:
the auxiliary wiring and the touch wiring comprise the same material.

8. The display device of claim 5, wherein:
the common voltage line comprises a first common voltage line disposed in a first region of the substrate and a second common voltage line disposed in a second region of the substrate, and
the auxiliary wiring connects the first common voltage line and the second common voltage line.

9. A display device comprising:
a substrate;
a first electrode and a second electrode disposed on the substrate and facing each other;
an emission layer disposed between the first electrode and the second electrode;
a common voltage line disposed on the substrate and connected to the second electrode to transmit a common voltage;
a thin film encapsulation layer covering the second electrode;
an auxiliary wiring disposed on the thin film encapsulation layer and connected to the common voltage line;
an insulating layer covering the auxiliary wiring;
a touch wiring disposed on the insulating layer; and
a covering layer covering the touch wiring.

10. The display device of claim 9, wherein:
the auxiliary wiring is in contact with a side wall of the thin film encapsulation layer.

11. The display device of claim 9, wherein:
the common voltage line comprises a first common voltage line disposed in a first region of the substrate and a second common voltage line disposed in a second region of the substrate, and
the auxiliary wiring connects the first common voltage line and the second common voltage line.

12. The display device of claim 8, wherein:
the substrate is divided into a display area emitting light, and a peripheral area enclosing the display area, and
the auxiliary wiring is disposed in the peripheral area.

13. The display device of claim 8, wherein the auxiliary wiring is disposed on the thin film encapsulation layer.

14. The display device of claim 9, wherein the auxiliary wiring and the touch wiring are disposed to overlap each other in plan view.

15. The display device of claim 9, wherein the touch wiring comprises:
at least two first touch electrodes; and
a first connection line connecting the at least two first touch electrodes,
wherein the first connection line extends in a first direction.

16. The display device of claim 15, wherein the auxiliary wiring extends in a second direction perpendicular to the first direction.

17. The display device of claim 16, wherein the auxiliary wiring is disposed between the at least two first touch electrodes.

18. The display device of claim 16, wherein the touch wiring further comprises:
at least two second touch electrodes; and
a second connection line connecting the at least two second touch electrodes,
wherein the second connection line extends in the second direction.

19. The display device of claim 18, wherein the auxiliary wiring overlaps the second connection line in plan view.

\* \* \* \* \*